United States Patent
Sardi et al.

(10) Patent No.: US 7,409,616 B1
(45) Date of Patent: Aug. 5, 2008

(54) BUILT IN SELF TEST SYSTEM AND METHOD FOR DETECTING AND CORRECTING CYCLE SLIP WITHIN A DESERIALIZER

(75) Inventors: Mohamed Sardi, Santa Clara, CA (US); Paul Scott, San Jose, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 762 days.

(21) Appl. No.: 10/876,990

(22) Filed: Jun. 25, 2004

Related U.S. Application Data

(60) Provisional application No. 60/482,918, filed on Jun. 27, 2003.

(51) Int. Cl.
*G01R 31/28* (2006.01)
(52) U.S. Cl. ...................... 714/738; 714/736
(58) Field of Classification Search .................. 714/736, 714/738
See application file for complete search history.

(56) References Cited

U.S. PATENT DOCUMENTS

| | | | |
|---|---|---|---|
| 5,128,940 A | | 7/1992 | Wakimoto |
| 5,502,748 A | * | 3/1996 | Wilkinson ................ 375/354 |
| 5,790,563 A | * | 8/1998 | Ramamurthy et al. ....... 714/736 |
| 6,078,937 A | | 6/2000 | Vatinel |
| 6,459,393 B1 | * | 10/2002 | Nordman ................... 341/100 |

OTHER PUBLICATIONS

Lin et al., A BIST Methodology for At-Speed Testing of Data Communications Transceivers, Dec. 4-6, 2000, IEEE, pp. 216-221.*

* cited by examiner

*Primary Examiner*—Jacques Louis-Jacques
*Assistant Examiner*—John J Tabone, Jr.
(74) *Attorney, Agent, or Firm*—Kevin L. Daffer; Daffer McDaniel, LLP

(57) ABSTRACT

A system and method are provided for built-in-self test of any bits that have slipped from their appropriate positions within a frame character clock cycle. If a bit has slipped, then the built-in-self test mechanism can also implement either a clock generation stretch operation or a barrel shift operation to readjust the frame boundary output from a receiver with a 1-to-N deserializer. A pseudo-random bit sequence can be generated having the same logic value in both the receiver and transmitter, where the output of the deserializer which receives the transmitted bits is compared bit-by-bit with the receiver-generated bits as part of the built-in-self test mechanism. If a bit is determined to have been slipped, then error correction occurs with aliasing and phase jitter in mind.

19 Claims, 10 Drawing Sheets

BUILT IN SELF TEST SYSTEM AND METHOD FOR DETECTING AND CORRECTING CYCLE SLIP WITHIN A DESERIALIZER

PRIORITY APPLICATION

The present application claims priority to provisional application No. 60/482,918 entitled "Built In Self Test (BIST) Architecture for Physical Layer Devices using Cycle Slip and Barrel Shifter Framing Methods in a Deserializer," filed Jun. 27, 2003.

BACKGROUND OF THE INVENTION

1. Field of the Invention

This invention relates to electronic circuitry and, more particularly, to a communication system having a receiver that uses a built-in-self-test (BIST) circuit and method to test for and correct any cycle slip that occurs within a deserializer output of the receiver. One or more bits within a related set of bits of a serial bitstream that slip to a successive frame clock cycle are detected using two similar pseudo random bit sequences (PRBSs) received upon the receiver and generated within the receiver, and any cycle slip occurrences can be corrected by either extending the frame clock cycle or shifting the boundary between a pair of register outputs using a barrel shifter.

2. Description of the Related Art

The following descriptions and examples are not admitted to be prior art or conventional by virtue of their inclusion within this section.

Communication between nodes of a communication system typically involves a serial bitstream. Examples of serial bitstream transfer protocols include Ethernet and Synchronous Optical Network (SONET), as well as numerous others. An integral part of the serialized communication between nodes is the transceiver associated with each node. A transceiver having both a receiver and a transmitter functions not only to recognize the transfer protocols, but also converts the serial bitstream to multiple bitstreams if necessary. The conversion from a relatively high bit rate serial bitstream to a set of relatively low bit rate parallel bitstreams takes place within a receiver and, more specifically, within a deserializer of the receiver.

The serializer and deserializer of the transceiver are normally found within the physical media attachment (PMA) sub-layer of the transceiver. The serializer/deserializer is responsible for supporting multiple communication protocols and allows presentation of encoding schemes to the upper layers of, for example, the Open System Interconnection (OSI) model. A useful feature of a deserializer within the physical layer PMA of the OSI model is that the deserializer can frame its output once synchronization between its serial bitstream of related bits and parallel output of related bits is achieved.

Framing is used in the normal mode to reframe data in backplane tranceivers and, as such, is an integral part of the IEEE 802.3z Gigabit Ethernet and Fibre Channel Standards set forth in http://www.ieee.org and http://www.fibrechannel.org. Framing of serial data is, therefore, the conversion of the serial bitstream to respective frames output in parallel from the deserializer. Certain bits within the serial bitstream are related to one another and thus belong within the same frame output from the deserializer.

A typical receiver within a communication system involves both a deserializer and a clock generator. The deserializer receives a serial bitstream of data broken into related sets of bits known as characters. For example, a first character of $A_0$-$A_{15}$ will be immediately followed by a second character $B_0$-$B_{15}$. Each character is preferably output from the deserializer within a single frame. Thus, in this example, all 16 character A bits are output in parallel within a single frame cycle, followed by all 16 character B bits output in parallel in the immediately succeeding frame cycle. Thus, the serial bitstream is sampled on the input of the deserializer according to a bit clock cycle, and the parallel output from the deserializer occurs every frame clock cycle. If there are 16 bits output per frame, then the frame clock cycle is equal to 16 times the bit clock cycle.

There are numerous types of deserializers known in the industry. For example, a deserializer can be formed from shift registers. As the serial bitstream is received on the shift registers, the bit clock will shift serial bits into and through the registers, and a character or frame of related bits, is captured each time the shift registers are filled, once per frame cycle. Another type of deserializer involves a staged or pipelined deserializer. A popular pipelined deserializer is described in U.S. Pat. No. 5,128,940 herein incorporated by reference. Each stage of the pipelined deserializer includes one or more 1-to-2 demultiplexer cells, where each stage can be clocked by successively slower clock rates produced by the clock generator.

Regardless of the type of deserializer used, a problem known as "bit shift" or "bit slip" oftentimes occurs. As described in U.S. Pat. No. 5,128,940, due to margin differences from one demultiplexer cell to another, related bits ($A_0$-$A_{15}$) may not necessarily appear within the same frame output simultaneously from the final stage of the deserializer. There can be many causes for the bit shift/slip problem, one such cause might be due to the uncertainty in the initial period of the signal input. There are many mechanisms for correcting a bit slip occurrence, such as applying control signals selectively to the control clocks forwarded to each stage of the pipelined deserializer. Other mechanisms can also come into play. Regardless of how a bit slip occurs or how it is corrected, it is important to be able to detect a bit that should be in one frame, yet appears in the succeeding frame.

It would be desirable to introduce a built-in-self-test (BIST) mechanism for detecting a bit slip/shift occurrence at the output of a deserializer. Moreover, the BIST architecture would benefit by being applicable to any type of deserializer, regardless of whether the deserializer is a pipelined deserializer, a shift register, or simply a programmable state machine, such as a programmable logic device or execution unit which receives software instructions.

The desired BIST architecture must also be applicable to any bit transfer rate, even the higher bit rates of SONET and Gigabit Ethernet. In addition, the desired BIST architecture must also implement bit slip/shift correction techniques in order to realign or resynchronize the frame boundaries even though a shift might occur within the deserializer. Any improvements in the BIST and error correction capabilities must be performed with minimal added complexity, design costs and architecture/layout size.

SUMMARY OF THE INVENTION

The problems outlined above are in large part solved by an improved communication system that utilizes both BIST and error correction circuitry within transceivers of the communication system. Specifically, the BIST system and method hereof not only determines any bit slip/shift occurrences attributable to a cycle slip within a deserializer, but also corrects the cycle slip or bit slip occurrence. The BIST system and method can be applied to any type of deserializer, such as pipelined deserializers or simply shift register deserializers.

Preferably, the BIST system avoids using a special framing character sent to the receiver via a transmitter over the communication channel, and using the same special framing character generated within the receiver itself. Avoiding a framing character will avoid implementing a dedicated comparator for comparing any shift in the received framing character and the receiver-generated framing character. If, indeed, the framing characters are the same, then any offset in the deserializer output will be detected when comparing to the benchmark framing character generated within the receiver.

Since framing boundaries can shift over time, even after the boundary is initially synchronized with a special framing character, it is then recognized that a PRBS must also be transmitted to and generated within the receiver to periodically resynchronize the frame boundaries. Since PRBS is typically utilized anyway, the special framing character can be eliminated in favor of periodically comparing PRBSs. Thus, a single comparator used to compare the PRBS frame in lieu of another comparator needed to compare the special framing characters represents a substantial reduction in the complexity of the overall BIST system.

Once a shift is detected by comparing the received PRBS signal at the output of the deserializer to the receiver-generated PRBS, correction of that shift can take place in many ways. For example, the frame clock cycle can be stretched or extended by one bit cycle to append the shifted bit in the succeeding cycle into the preceding frame cycle. According to another example, a barrel shifter can be used to select one or more bits in a preceding cycle to be combined with one or more bits in a succeeding cycle, where both cycles are temporarily stored in separate registers that feed into corresponding inputs of a series of multiplexers. Deciding which bit from the two sets of registers is to be selected depends of an offset value sent to the barrel shifter selection input.

Determining when a bit slip/shift or cycle slip error has occurred, and determining how to remedy this error, takes place within a state machine. The state machine can send a slip bit signal to extend the frame clock or can send an offset signal to the barrel shifter, depending on which type of correction circuit is desired. Outputting the appropriately timed slip bit signal and offset signal to the outputs of the deserializer will continue until the frame boundaries at the deserializer output match up with the characters forwarded as a serial bitstream to the deserializer. When this occurs, framing is said to be achieved. The state machine can advantageously operate at speeds slower than the frame clock cycle in order to reduce power consumption. Additionally, the state machine can utilize wait states to alleviate any aliasing problems that might occur whenever a boundary has been shifted.

The state machine can also enter into a locking mode once the appropriate bit shift or movement correction has taken place. However, even within locking mode, any jitter or bit errors that might cause the phase-locked loop (PLL) clock recovery to come out of a locked condition will be detected by the state machine. After a predetermined number of times in which successive frame clocks determine an out-of-lock condition, the state machine will transition from the locking mode to a tracking mode which will cause regeneration of the PRBS benchmark comparison to determine if a slip bit has occurred. Transitions between the tracking mode and the locking mode thereby depends on whether a slip bit has been detected, and whether an unlocked condition has occurred over successive frame cycles.

According to one embodiment, a data communication receiver is provided. The receiver includes a bit generator coupled to generate a parallel set of data bits. The parallel set of data bits are thereby generated as PRBS data bits within the receiver itself. The receiver also includes a deserializer coupled to receive a serial bitstream having the same logic value as the set of data bits sent across a communication channel to the receiver. Thus, the same logic value of PRBS data bits is generated external to the receiver and sent across the communication channel.

The receiver also includes a comparator that is coupled to the bit generator and the deserializer for comparing the parallel set of data bits to the deserialized serial bitstream. The output of the deserializer can then be modified if the deserialized serial bitstream contains one or more bits dissimilar from the parallel set of data bits. Preferably, comparison occurs within one frame cycle and the output of the deserializer is modified by either extending the frame clock cycle used by the deserializer output or selecting certain sets of bits from a first frame cycle and certain sets of bits from a second frame cycle using, for example, a barrel shifter.

According to yet another embodiment, a data framing boundary test and correction system is provided. The system includes a transmitter and a receiver. The receiver is coupled to the transmitter to receive a serial bitstream of data bits sent from the transmitter. The receiver includes a deserializer for converting the serial bitstream of data bits into a deserialized set of bitstream. A bit generator can also be used to generate a parallel set of data bits equal in logic value to the serial bitstream of data bits. A circuit is used to move bits within a single frame cycle at the output of the deserializer into an immediately preceding frame cycle if the deserialized serial bitstream contains a bit dissimilar from the parallel set of data bits.

The circuit can include a state machine that moves the bit if more than one comparison and, preferably at least three comparisons, of the parallel set of data bits within the deserialized serial bitstream generated externally yields a bit dissimilar from the parallel set of data bits generated locally. Thus, in this example, three successive errors must occur before the bit is moved. Also, for purposes of aliasing reduction, the state machine forwards a modified deserialized serial bitstream having a moved bit at the output of the deserializer to a comparator, which then compares the modified deserialized serial bitstream to the parallel set of data bits at least N times and, preferably, 2N times where N is equal to the number of bits within the parallel set of data bits.

According to yet another embodiment, a method is provided. The method includes a method for framing serial data. The method includes comparing a deserialized serial data within a frame cycle to a parallel set of data bits that are chosen to be equal in logic value to the serial data. Due to bit shift/bit slip occurrences, the data bits may be dissimilar. A bit is moved from one frame cycle to another frame cycle if the deserialized serial data has a bit at a Nth bit position that is dissimilar in logic value than a bit at the Nth bit position of the parallel set of data bits. Moving can be effectuated using either an offset value input to a barrel shifter or a slip bit signal input to a frame clock extension generator.

BRIEF DESCRIPTION OF THE DRAWINGS

Other objects and advantages of the invention will become apparent upon reading the following detailed description and upon reference to the accompanying drawings in which.

Figure 1:
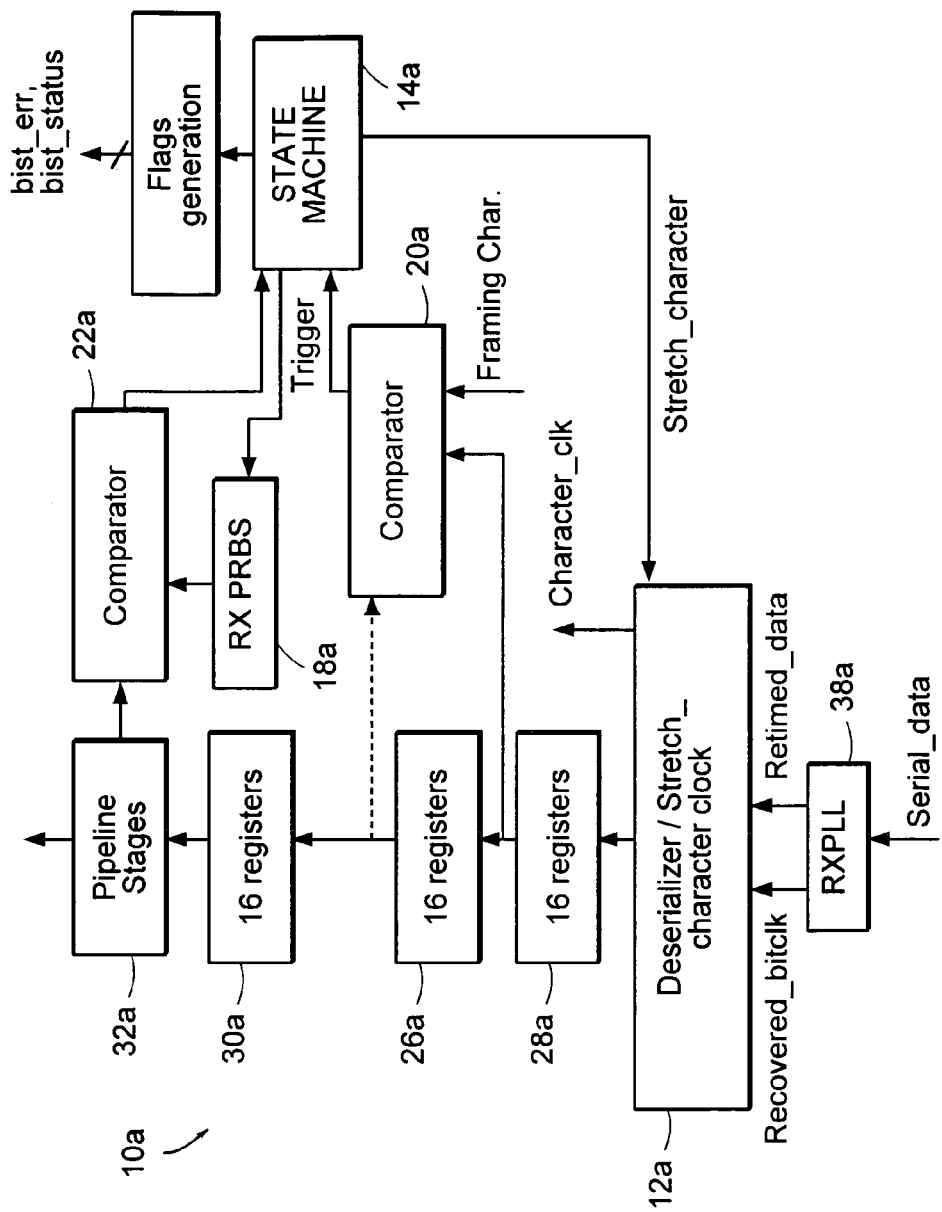
FIG. 1 is a circuit schematic diagram of a receiver comprising a 1-to-N deserializer with an internal frame clock cycle stretch timing generator, a comparator for comparing a framing character at the receiver with a received framing character to initially synchronize the incoming character, and another comparator for comparing a PRBS at the receiver with a received PRBS to maintain character synchronization.

While the invention is susceptible to various modifications and alternative forms, specific embodiments hereof are shown by way of example in the drawings and will herein be described in detail. It should be understood, however, that the drawings and detailed description thereto are not intended to limit the invention to the particular form disclosed, but on the contrary, are intended to cover all modifications, equivalents, and alternatives falling within the spirit and scope of the present invention as defined by the appended claims.

DETAILED DESCRIPTION OF PREFERRED EMBODIMENTS

Turning now to FIG. 1, receiver 10a is shown having a 1-to-N deserializer 12a, and a state machine 14a that controls the deserializer 12a and a frame cycle clock generator within deserializer 12a. Receiver 10a is shown as a physical layer device that performs a deserializing function. As part of the deserialization process, receiver 10a also includes a BIST circuit that tests the functionality of various physical devices, including the transmit and receive phase-locked loops (PLLs), encoders, and decoders, etc. The BIST circuit can also be used to measure AC parameters such as jitter.

Receiver 10a is shown having three functional blocks. The first block is a bit generator which generates a sequence of pseudo-random bits in the transmitter side, and sends the PRBS across the communication channel to receiver 10a. The same bit sequence that generates the PRBS bits within the transmitter is also generated in the receiver 10, and is shown as block 18a. The choice of this generator can depend on the application (i.e., SONET/SDH, Ethernet, etc.) devices, the clock recovery performance, or architecture of the device, where the purpose of the PRBS bits is to have the highest testing coverage. Thus, the second functional block implements the same sequence generator in the receiver side as the transmitter side, as shown by block 18a.

The third functional block is the framing mechanism implemented in the receiver side, and comprises state machine 14a and a network of comparators. A first comparator 20a may be used to compare a special framing character, whereas a second comparator 22a can be used to compare the PRBS sent across the communication channel with the internally-generated PRBS. Details of comparator 20a functionality are set forth in FIGS. 3 and 4, whereas comparator 22a functionality is described in FIG. 7.

Comparator 20a essentially compares a special framing character generated internal to the receiver with the same framing character sent serially across the communication channel. The deserialized framing character received from the communication channel via deserializer 12a can then be parsed into two separate registers, labeled as first register 26a and second register 28a. First register 26a receives a parallel set of bits immediately prior to second register 28a receiving a parallel set of bits. Registers 26a and 28a capture the parallel bits within successive frame clock cycles.

Like comparator 20a, comparator 22a also compares a benchmark set of bits with bits sent across the communication channel, and stored in register 30a. Successive frame clock cycles places the deserialized bits into subsequent pipeline stages, as shown by block 32a. One or more of those stages can be compared with the receiver-generated PRBS to detect any bit slips/shifts. Receiver 10a generally utilizes PLL 38a to receive the serial data and recover a bit clock cycle. The serial data can be retimed based on the PLL achieving lock status. The retimed data is then sent to deserializer 12a, along with the bit clock.

Figure 2:
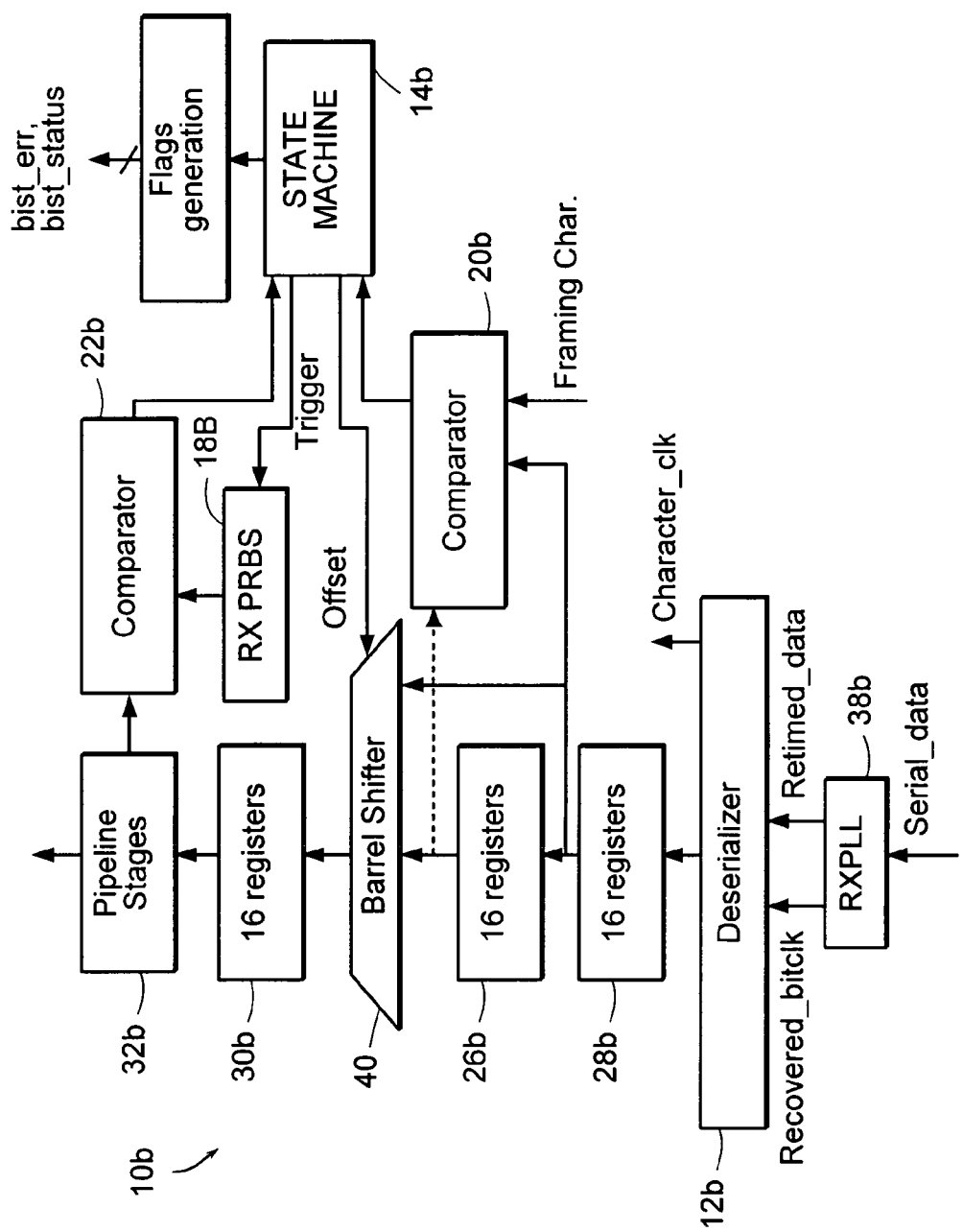
FIG. 2 is a circuit schematic diagram of a receiver comprising a 1-to-N deserializer with an external barrel shifter, a comparator for comparing a framing character at the receiver with a received framing character to initially synchronize the incoming character, and another comparator for comparing a PRBS at the receiver with a received PRBS to maintain character synchronization.

FIG. 1 illustrates a stretch character clock sent from state machine 14a to deserializer 12a. By stretching or extending the frame clock cycle by one bit clock cycle, any bits in a subsequent frame clock can be captured in the preceding frame clock to realign the frame boundary. FIG. 2 illustrates another receiver 10b that performs the frame boundary resynchronization using an external barrel shifter, rather than an internal (i.e., internal to the deserializer) frame clock cycle stretch or extension circuitry.

Barrel shifter 40 within receiver 10b of FIG. 2 essentially shifts the boundary depending on the amount of offset sent from state machine 14b. Similar to comparators 20a and 22a, comparators 20b and 22b compare the framing character and the PRBS generated internal to the receiver 10b, with a framing character and a PRBS sent from a transmitter to deserializer 12b. The framing character and PRBS generated internal to receiver 10b contains the same logic values as the framing character and PRBS sent from a transmitter. Both the framing character and PRBS contain logic values of the same bit positions of a parallel set of bits received upon comparators 20b and 22b, as well as comparators 20a and 22a. Where, within the two sets of registers 26a/b and 28a/b, a bit shift has occurred, comparator 20a/b will detect that bit shift based on its comparison to the framing character, and produce the corresponding frame cycle extension (as in FIG. 1) or the offset (as in FIG. 2).

A comparison of FIGS. 1 and 2 illustrate two dissimilar circuits within receiver 10a/b used to frame a serial bitstream. FIG. 1 illustrates a cycle slip circuitry within deserializer block 12a used to stretch a frame cycle upon receiving a slip bit signal (i.e., stretch character signal). FIG. 2 illustrates a barrel shifter outside of deserializer 12b. The cycle slip circuitry is used to move an imaginary character frame across an incoming serial bitstream one bit at a time. Each time a slip bit signal is asserted, a bit is slipped such that the parallel data character out of the deserializer 12a represents a frame that is moved forward in the serial bitstream by one data bit.

When the framing character is detected by comparator 20a, state machine 14a is used to trigger a stretch character, or slip bit control signal that is then sent to the deserializer 12a. This latter operation causes a byte to be aligned on the deserializer output. The received framed data is then continuously compared to the sequence generated by the receive sequence generator. As shown in FIG. 1, framing is performed by use of a framing character that needs to be detected. The detection of such characters requires N times N+1 XOR logic gate comparison function, where N is the number of bits output from deserializer 12a in parallel. The cycle slip mechanism of FIG. 1 is only used to present framed characters by stretching the character clock or frame cycle clock in increments of bit clock cycles at the output of deserializer 12a.

In the barrel shifter implementation of FIG. 2, barrel shifter 40 is used to frame the serial bitstream using the same comparator functionality as FIG. 1. When the framing character generated internal to receiver 10b is detected by selecting bits within two separate cycles stored in registers 26b and 28b, state machine 14b is used to trigger the receive PRBS 18b. The received framed data is then continuously compared to the sequence generated by the received PRBS 18b to determine any bit shifting which might have occurred through deserializer 12b.

In both FIGS. 1 and 2, a special framing character is first needed to detect any bit shifts that have occurred within the deserializer. If so, then the comparator 20a/b will send a signal to state machine 14a/b to trigger a receive PRBS sequence of bits within generator 18a/b. Continuous compares can occur thereafter for subsequent transmissions of PRBS bits to realign or resynchronize frame boundaries as needed. FIGS. 1 and 2 illustrate use of the special framing characters in both the cycle slip framer of FIG. 1 and the barrel shift framer of FIG. 2. Such special framing characters require an additional comparator 20a/b, as well as corresponding pairs of registers 26a/28a and 26b/28b.

Figure 3:
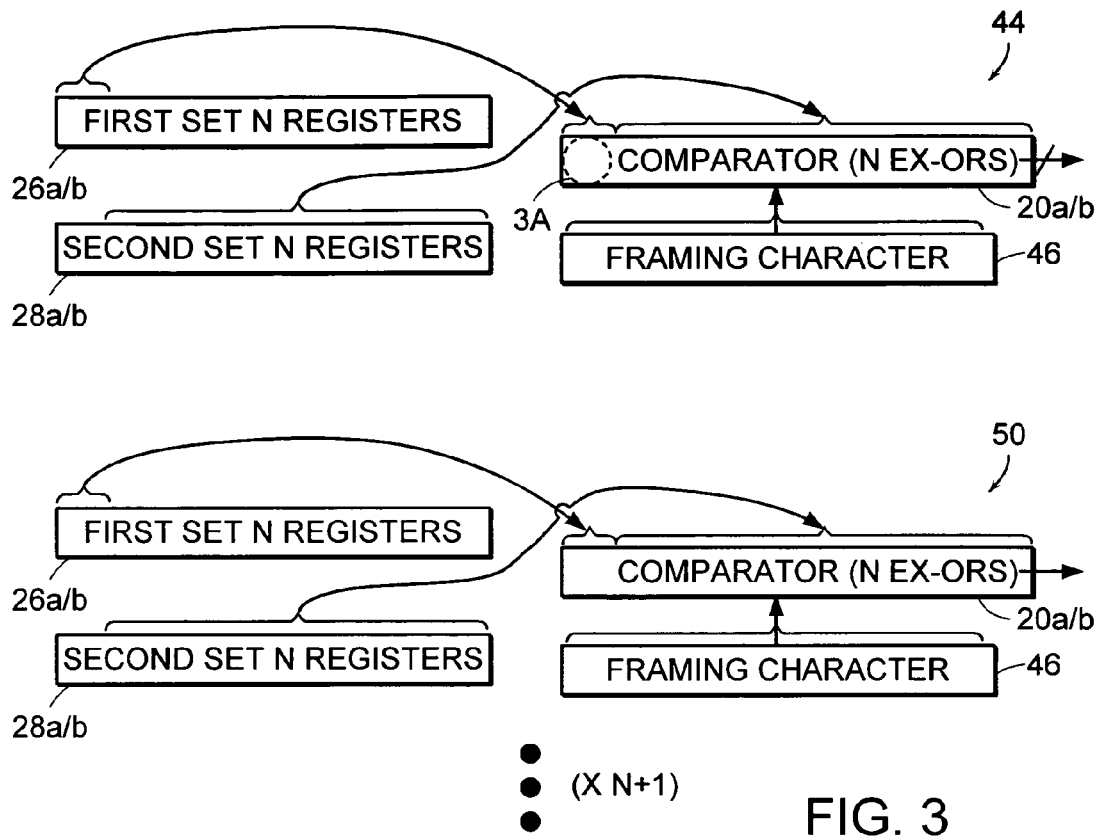
FIG. 3 is a block diagram of the first and second registers and comparator of FIG. 1 undergoing successive shifting of bits within the registers and corresponding comparisons within the comparator.
Figure 4:
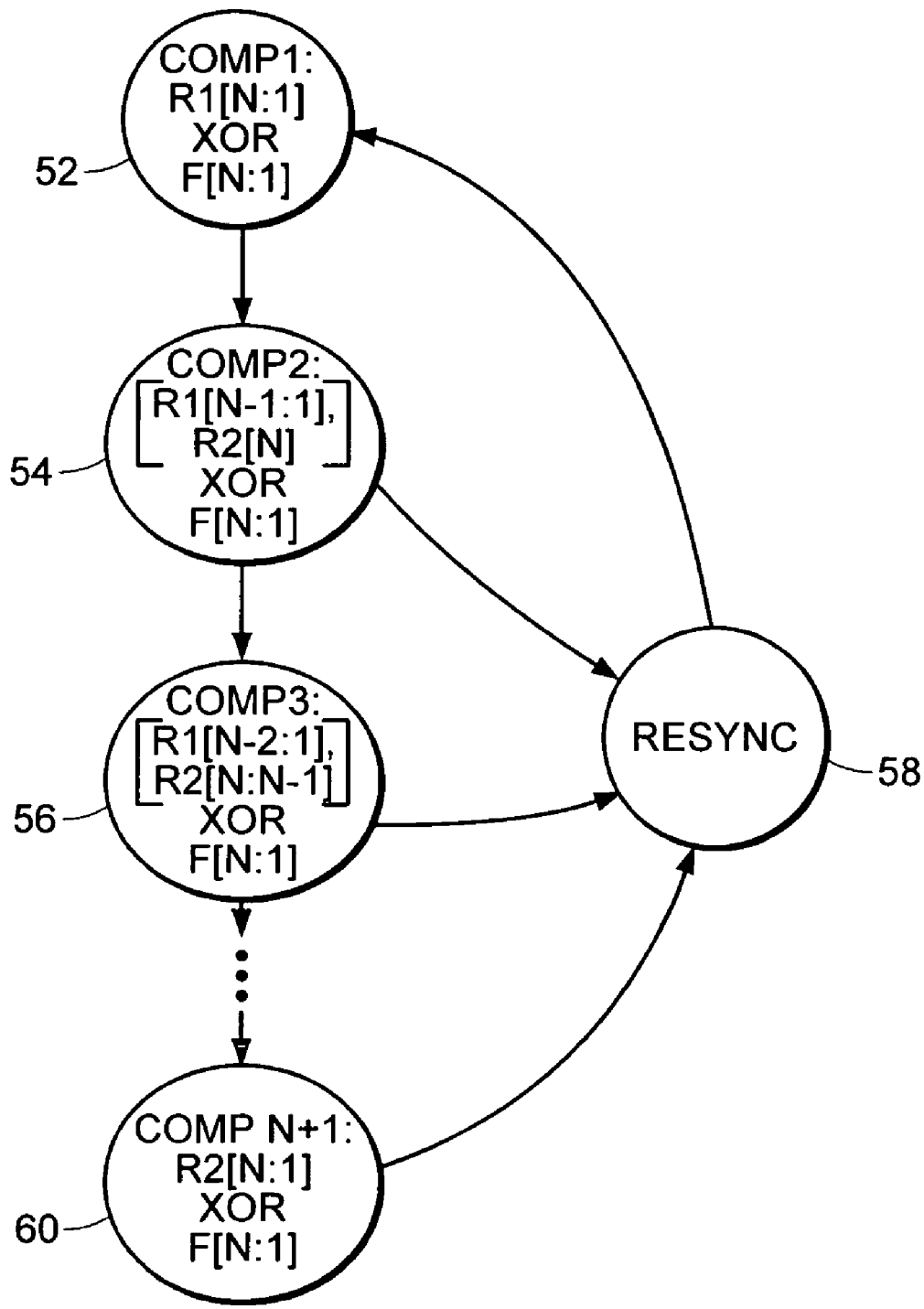
FIG. 4 is a state diagram of the successive shifting and comparing functions of FIG. 3 each time a synchronization is needed.

When performing the comparison within comparator 20a/b, additional XOR functions are needed; thus, adding complexity to the overall receiver. Moreover, using framing characters offer no assurances of convergence in a given time. Thus, the receiver must wait for the framing character or for sequence detection. Moreover, an aliasing phenomenon may occur that could prevent a convergent framing mechanism using a framing character. When the framed character boundary is found in the solutions offered in FIGS. 1 and 2, stretching of the character clock or frame clock cycle, or offsetting selection between one cycle and the next (as in the barrel shifter solution), may cause a loss of bits that would lessen the possibility of quick convergence. A more preferred solution to that shown in FIGS. 1 and 2 is the cycle slip receiver 10c and barrel shift receiver 10d of FIGS. 8 and 9. FIGS. 3 and 4 illustrate one reason for the more preferred mechanism of FIGS. 8 and 9.

Figure 3A:
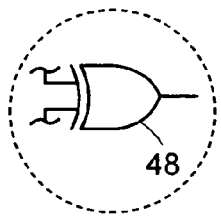
FIG. 3a is a schematic diagram of a logic gate included within the comparator depicted in FIG. 3.

Turning to FIG. 3, the utilization of the first and second registers 26a/b and 28a/b of FIGS. 1 and 2 is shown relative to comparator 20a/b and the receiver-generated framing character. Specifically, reference numeral 44 indicates a comparison function between the framing character 46 and bit N within first register 26a/b and bit N−1:1 of second register 28a/b. Comparator 20a/b will compare bit-by-bit the appended bits from first and second registers with framing character 46 using N number of XOR logic gates 48, one of which is depicted in FIG. 3a. Each logic gate receives a bit within one of the Nth bit positions of framing character 46 corresponding to a bit of the appended, deserialized bit within registers 26 and 28. The comparison step 44 is repeated at step 50 by continuously shifting the appended boundary between the first and second registers 26 and 28 as shown. As the number of bits being appended from the first set of registers increase and those in the second set of registers decrease, eventually the proper boundary will be determined and will compare favorably to the framing character such that the XOR gates will all produce a logic 0 voltage value. Thus, FIG. 3 indicates that steps 44 and 50 are repeated N+1 times, where N is equal to the number of bits output in parallel from the deserializer.

FIG. 4 illustrates in more detail the N+1 comparison steps needed when comparing appended register pair outputs to a framing character. Specifically, FIG. 4 indicates a first comparison 52, where register 1 (R1) bits N:1 are compared through N XOR gates with framing character (F) bits N:1. If just one XOR gate produces a logic 1 value, then a second comparison occurs at step 54. Comparison step 54 is similar to that shown in FIG. 3, where R1[N−1:1] is appended to R2[N], and the appended sequence is compared to the framing character. Comparison step 56 is similar to step 50 of FIG. 3, and the comparison steps continue until the N+1 comparison has occurred. Each time, if the XOR gates produce all logic 0 voltage values, then resync state 58 has occurred. Meanwhile, it may be necessary to continue to the last comparison step as shown by step 60. The process is repeated each time a framing character is used.

As shown in FIGS. 3 and 4, there are N+1 comparison steps, where each step involves N XOR logic gate functions. Thus, comparator 20a/b of FIG. 2 entails significant XOR functions and the power consumption associated therewith.

Figure 5:
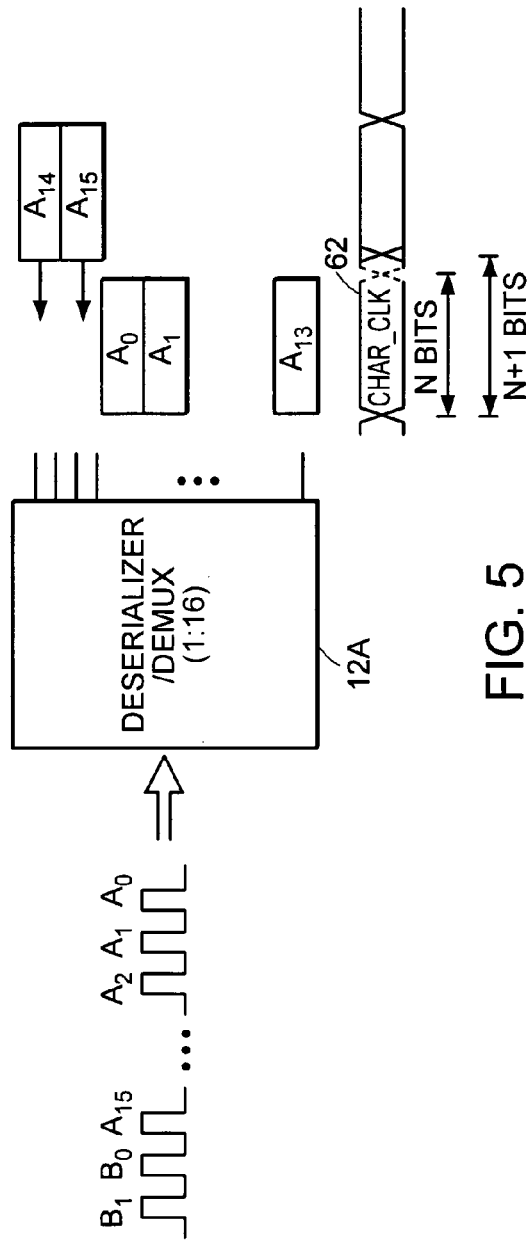
FIG. 5 is a plan diagram of a 1-to-N (N equals 16) deserializer having related serial-fed bits which form a character that is strewn or "slipped" between two successive frame cycles rather than all such related bits output from the deserializer in parallel within a single frame cycle.
Figure 6:
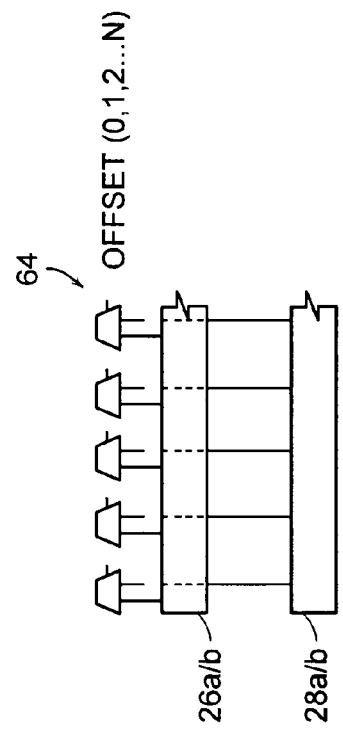
FIG. 6 is a block diagram of the first and second registers and barrel shifter of FIG. 2 undergoing successive offsets in the multiplexer inputs of the barrel shifter.

FIGS. 5 and 6 illustrate what occurs when a comparison function detects a bit shift. Specifically, FIG. 5 illustrates a character $A_0$-$A_{15}$ preceding character $B_0$-$B_{15}$ serially fed into deserializer 12a. If any bits associated with character $A_0$-$A_{15}$ are shifted and appear in a frame cycle or character cycle dissimilar from other bits of that character, then those bits are said to have been slipped or shifted. As shown in FIG. 5, bits $A_{14}$ and $A_{15}$ have shifted to the succeeding frame clock cycle. By extending the frame clock cycle from N bits, where N is equal to 16 in this example, to N+1 bits, the next bit cycle subsequent to $A_{13}$ will be included in the frame clock cycle 62 as shown. Thus, if bits $A_0$-$A_{13}$ are present in cycle 62, when by extended cycle 62 by one bit, the next bit in the serial sequence (i.e., $A_{14}$) will be included in cycle 62. However, if cycle 62 includes bits $A_0$-$A_{14}$, then by adding an additional bit to cycle 62 will cause the boundary to shift further so that bit $A_{15}$ is now included. The cycle slip framing mechanism of FIG. 5 occurs using the circuit 10a of FIGS. 1 and 10c of FIG. 8.

Instead of using a cycle slip framer, FIG. 6 illustrates a barrel shift framer where an offset value is sent to multiplex circuits 64. For example, if the offset is 0, then only the bits from first register 26a/b and not second register 28a/b are used. However, by adding an offset of 1, the most significant bit from register 26a/b will be used and the N−1:1 bits will be used from second register 28a/b. Therefore, the amount of offset will determine the boundary selection of related bits shifted between a first frame cycle used to store bits within register 26a/b and a second frame cycle used to store bits in register 28a/b.

Figure 7:
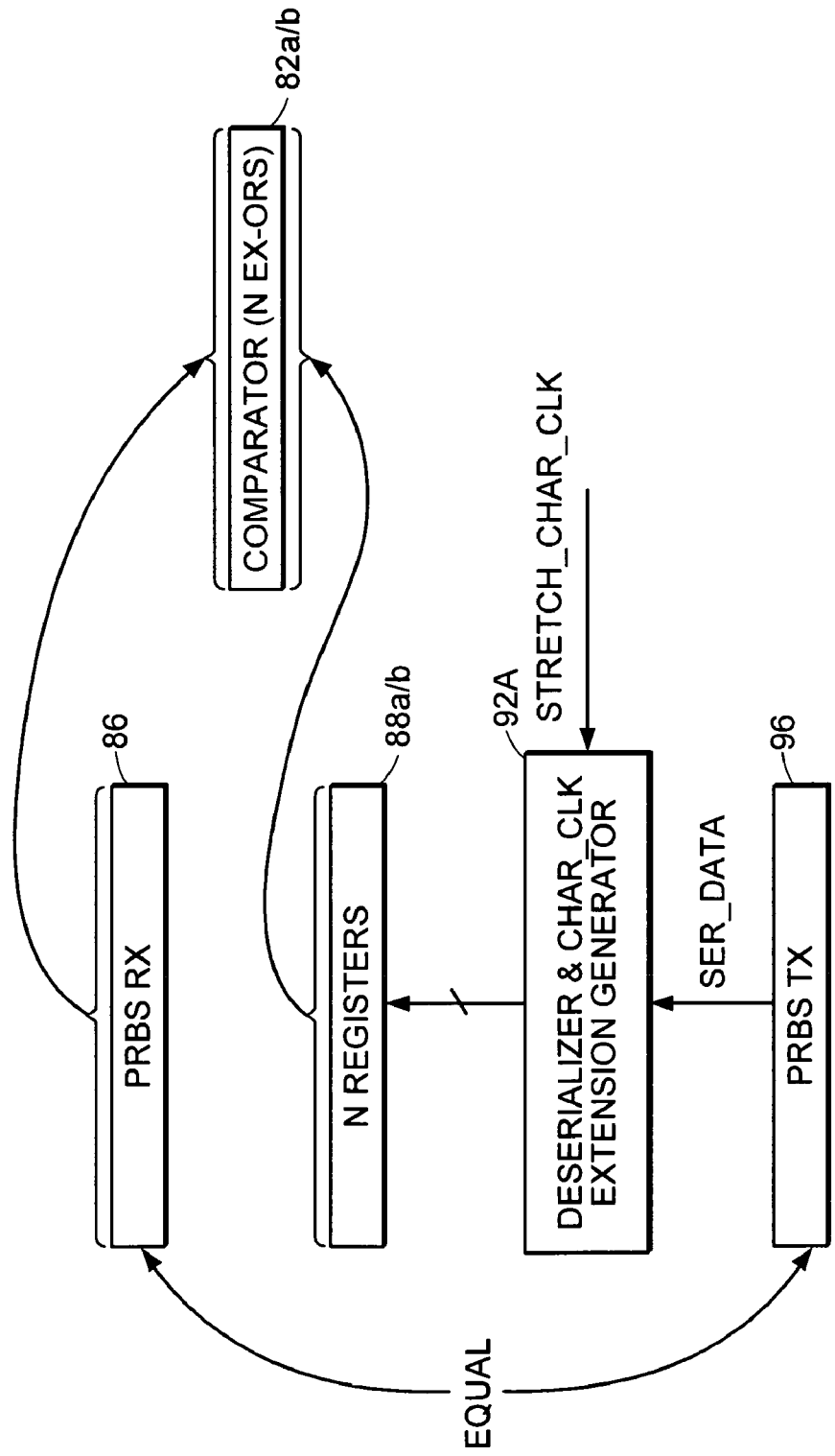
FIG. 7 is a block diagram of a single comparator within a receiver for comparing a PRBS at the receiver with a received PRBS absent the use of an initial framing character.
Figure 8:
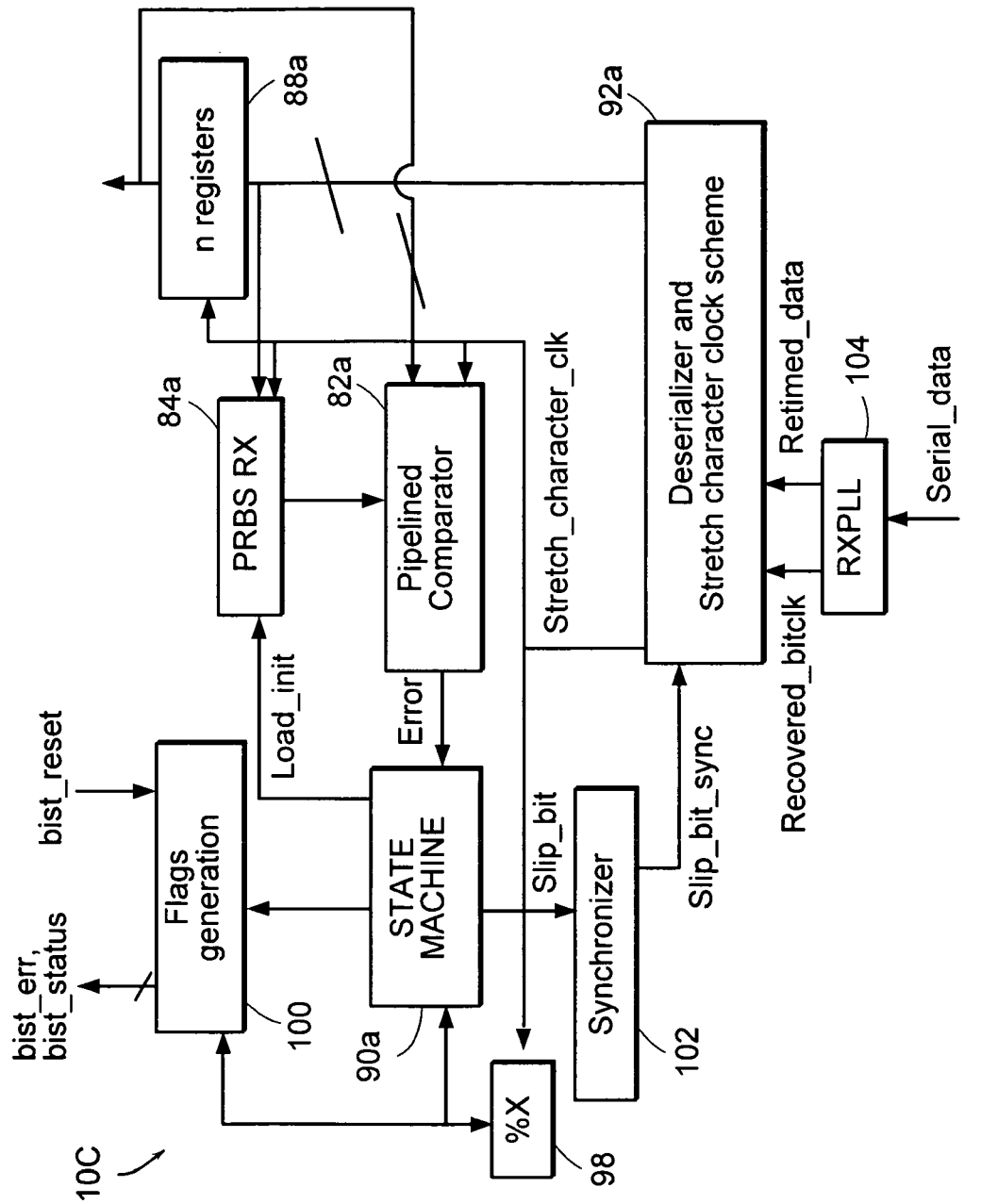
FIG. 8 is a circuit schematic diagram of a receiver comprising a 1-to-N deserializer with an internal frame clock cycle stretch timing generator and a single comparator for comparing a PRBS at the receiver with a received PRBS to initialize and maintain character synchronization.
Figure 9:
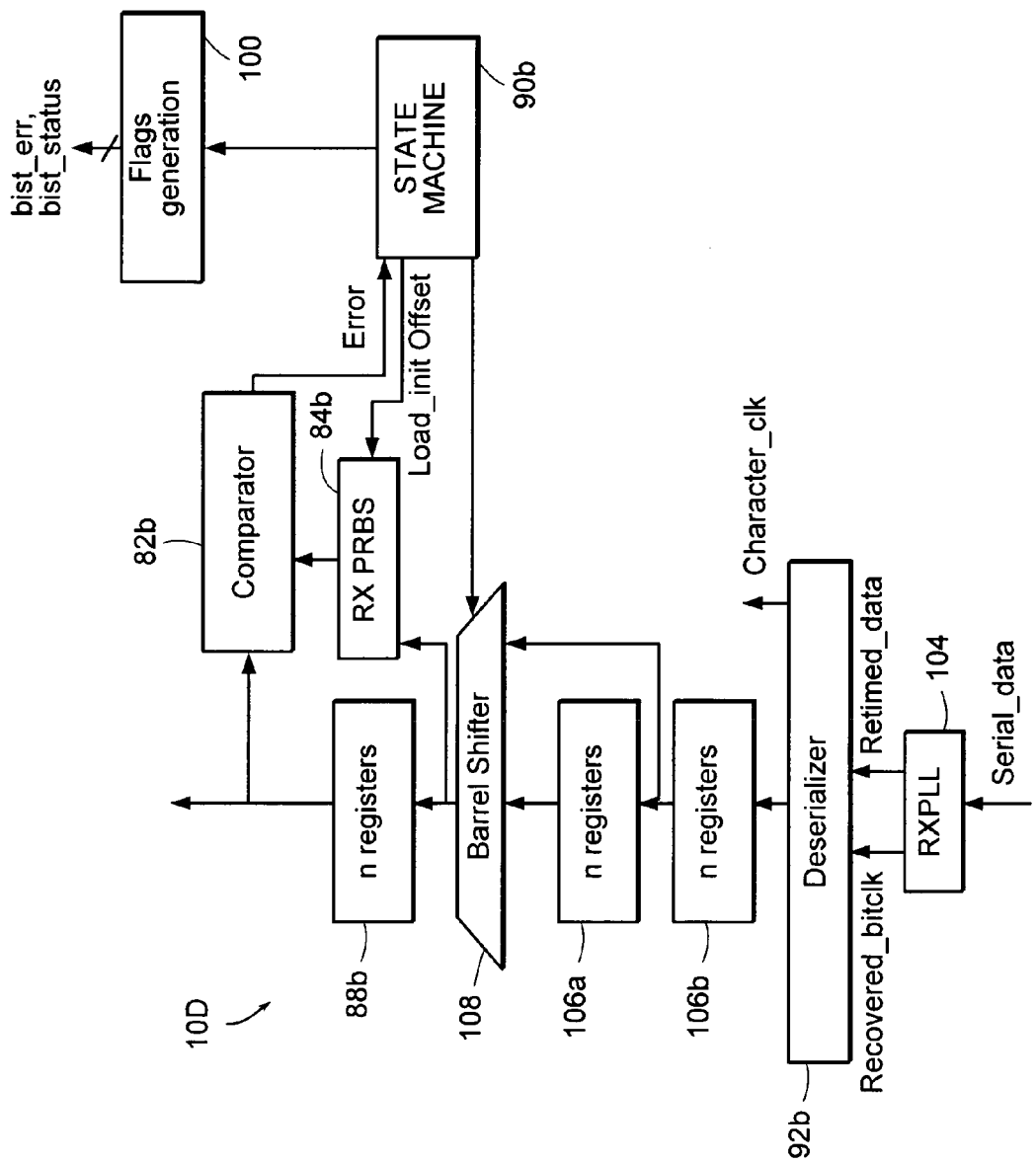
FIG. 9 is a circuit schematic diagram of a receiver comprising a 1-to-N deserializer with an external barrel shifter and a single comparator for comparing a PRBS at the receiver with a received PRBS to initialize and maintain character synchronization.

FIG. 7 illustrates what would occur if the first comparator 20a/b, and associated registers 26a/b and 28a/b are eliminated and the only comparison function is that which is shown in FIGS. 8 and 9, and represented as blocks 82a/b. Referring to FIGS. 7, 8, and 9 in conjunction, the PRBS generated internal to the receiver by blocks 84a/b produce a set of parallel bits 86. Bits 86 are compared by comparator 82a/b with a set of bits stored in registers 88a/b. Each bit position within registers 88 are compared with each bit position of the PRBS generated bits using XOR gates at each corresponding position. If one of the XOR gates produces a logic 1 voltage value, then it is known that a bit has slipped and an error signal is sent to state machine 90a or 90b, to allow either a cycle slip framer (FIG. 8) or a barrel shift framer (FIG. 9) to be used to correct that error.

FIG. 7 illustrates use of a cycle slip framer, where a stretch character clock or slip bit signal is sent to the clock generator of deserializer block 92a, also shown in FIG. 8. It is appreciated that block 92a of FIG. 7 can also be alternatively described as simply a deserializer block 92b absent any frame clock extension capability and, thus, is usable in the barrel shifter embodiment of FIG. 9, with block 92b illustrated therein. Regardless of whether a cycle slip framer or a barrel shift framer is used, the same logic values generated by the receiver as PRBS bits are also generated by the transmitter and sent across the communication channel, as shown by block 96. If no cycle slip has occurred, then the transmitted PRBS, when converted to parallel output by the deserializer 92, will match the receiver-generated PRBS at comparator 82. Otherwise, any dissimilarities will be detected as a cycle slip or bit slip occurrence.

FIGS. 8 and 9 illustrate avoidance of two sets of comparators in either the cycle slip framer 10c or the barrel shift framer 10d. In both embodiments 10c and 10d, the network of comparator functions is reduced by a factor of N+1 and no special framing characters are needed to perform any framing. The non-framed receiver-generated PRBS is loaded as an initial value to receiver 10c. If the receiver PRBS is the same as the bits generated by the transmitter sequence, then framing is considered successful. Finding the proper framing can be found by shifting the serial data stream by up to N times, where N represents the bus width of parallel bits. A study of the length of "aliasing sequence" must be done in order to know when the errors are due to a misalignment or errors are due to the communication link.

Receiver 10c illustrates a divide-by counter 98 that can be used to reduce the clocking rate of state machine 90a, as well as the flag generation circuitry 100. The clock reduction rate thereby helps reduce power consumption within what would normally be a high power consumptive state machine 90a. The slip bit signal generated by state machine 90a whenever an error is encountered can be sent to a synchronizer which reduces any metadata instability. Synchronizer 102 will thereby synchronize transitions of the slip bit signal to transitions of the bit cycle clock. Similar to FIGS. 1 and 2, the incoming serial bitstream is sampled by PLL 104 to recover the bit cycle clock and to retime the incoming serial bitstream of data. FIG. 9 also indicates a PLL 104 as well as flag generation block 100 which both have the same functions as those in FIG. 8. Instead of one set of registers 88a, FIG. 9 utilizes two sets of registers 106a/b since a barrel shifter 108 is used.

Figure 10:
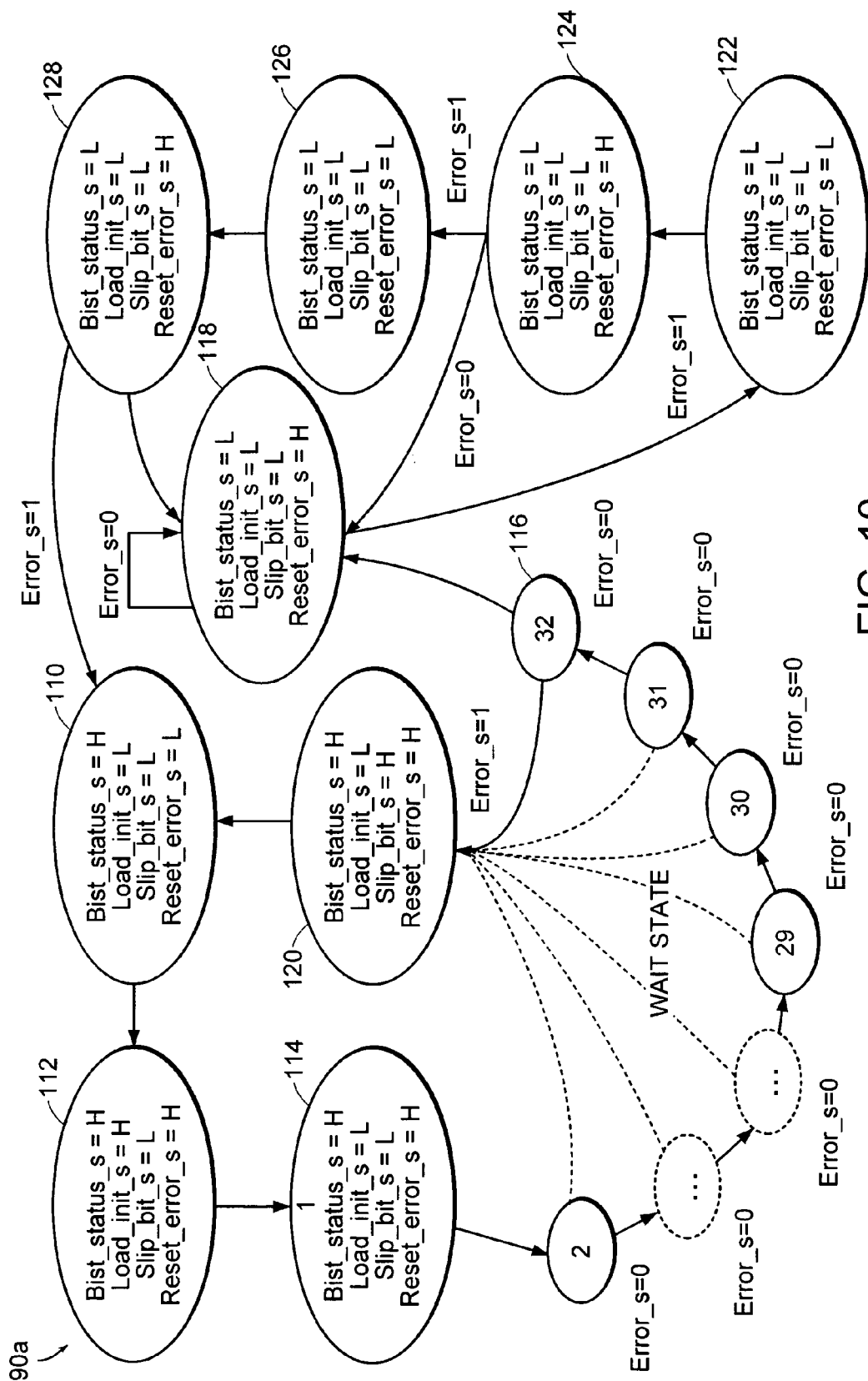
FIG. 10 is a state diagram of operations undertaken by the state machine of FIG. 8.

The operation of the cycle slip framer embodiment of FIG. 8 is better illustrated in reference to FIG. 10. Specifically, the various states of state machine 90a are shown in FIG. 10. When an error is encountered, state machine 90a will transition from a locking mode to a first state 110 of a tracking mode. The flag generation block will generate a reset error signal indicating the presence of an error, and then the PRBS generated at the receiver will be loaded as shown by state 112. A comparison is then performed a minimum of N times and, preferably, 2N times beginning at state 114. If each comparison yields no error when the Nth or 2Nth state has occurred, then state machine 90a will transfer from state 116 within the tracking mode back to state 118 within the locking mode. Otherwise, if an error is detected by a logic high voltage value on one of the XOR gates, then state 120 indicates need for assertion of a slip bit signal. The slip bit signal will extend the frame cycle clock to subsume the slipped bit.

The sequence of states 110 through 116 are repeated to determine if possibly another slip bit in a successive frame clock cycle need by asserted. If so, the boundary is cumulatively shifted one bit cycle for each time the slip bit signal is asserted. If the slip bit signal need not be asserted and there is no error at the output of the comparator, then state machine 90a will transition to state 118 to indicate the PLL is locked, and there are no aliasing problems encountered when the frame cycle has been shifted. If, however, an error occurs at the output of the comparator while in state 118, then X number of comparisons must be performed where, in the example provided, X is equal to 3. A first error will cause state machine 90a to transition from state 118 to state 122; a second error will cause transition from state 124 to state 126; and a third error will cause a transition from state 128 back into tracking mode at state 110. Thus, three successive errors indicates the PLLs have become unlocked, possibly due to a bit shift.

The wait state between states 114 and 116 indicates that an aliasing phenomenon can occur when bits are misaligned. The aliasing sequence can be N characters long or $2^N$ characters long. State machine 90a thereby includes two main modes, each having separate states. The tracking mode, shown at the left side of FIG. 10, occurs when a frame clock cycle indicates need for stretching by seeding an initial value of PRBS to the receive sequence generator, and continuously comparing the data generated by the receive sequence generator to the data output from the deserializer for a number of cycles larger than the longest alias sequence. The number of times the tracking mode loop may be covered is equal to the number of bits (N) of the parallel interface bus since the data stream can be misaligned by up to N bits.

The locking mode, shown at the right side of FIG. 10, occurs then no errors are encountered in the tracking mode, and framing is considered to be successful. However, errors can occur in the communication link due to jitter, noise, etc. Some of these errors are inherent and are usually defined under the bit error rate of the receiver and communication channel. The purpose of the locking mode is to detect when framing is lost. When more than X (in the example shown, X=3) consecutive errors are detected, the BIST mechanism is said to be out-of-lock and the framing is lost. Once the framing is lost, the BIST mechanism can then switch back to the tracking mode to begin reframing.

Figure 11:
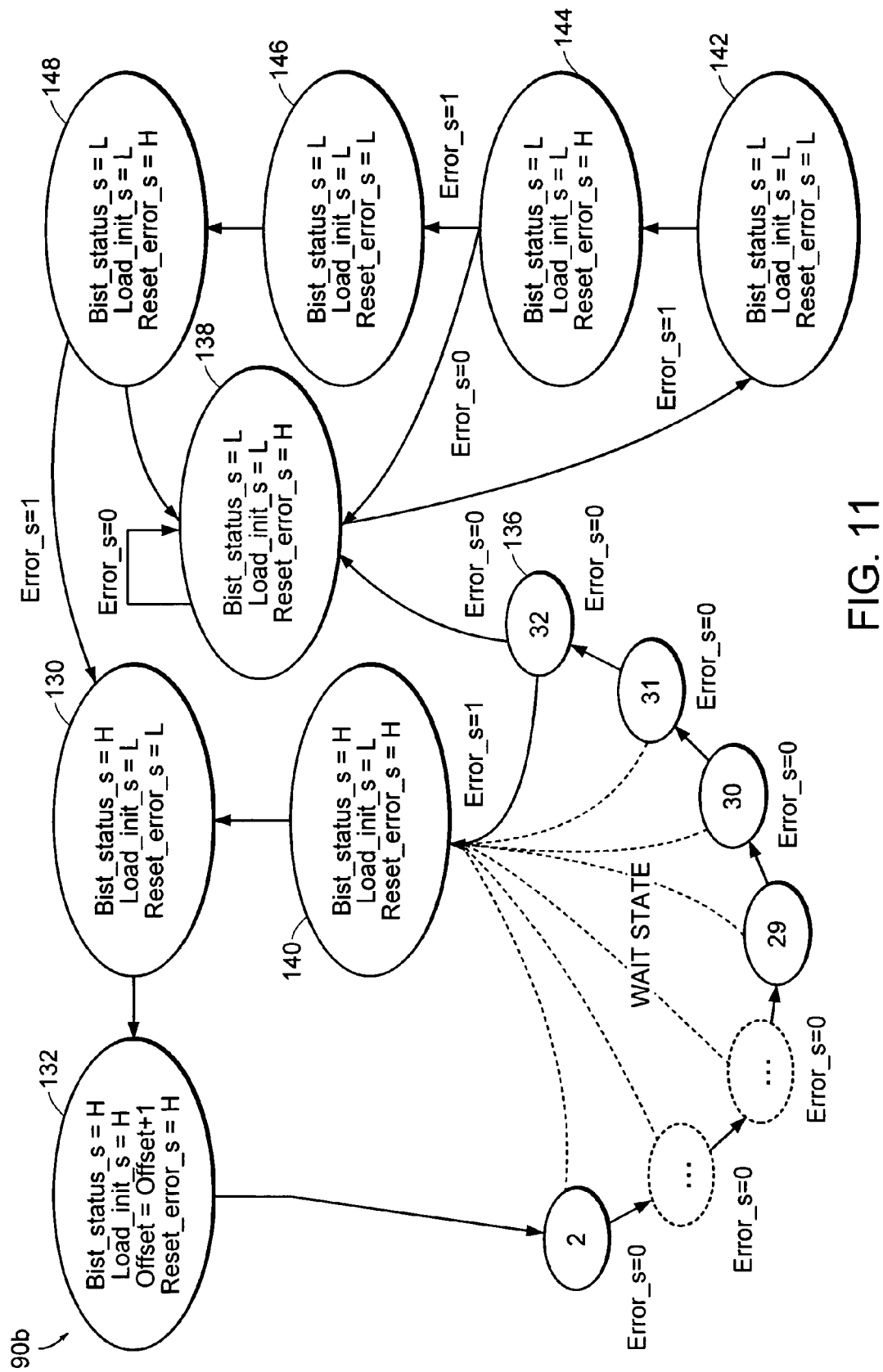
FIG. 11 is a state diagram of operations undertaken by the state machine of FIG. 9.

The barrel shift framer of FIG. 9 and, specifically, state machine 90b is best illustrated in reference to FIG. 11. Again, FIG. 9 illustrates only one set of comparators and, thus, the network of comparators is reduced by a factor of N+1. Moreover, no special framing characters are needed. A receiver-generated PRBS is used, similar to FIG. 8, and the values of the receiver-generated PRBS are compared to a deserializer output. Finding the proper framing boundary is performed by loading up to N times, where N represents the bus width, a new value shifted by one bit.

The state machine 90b illustrated in FIG. 11, indicates both tracking and loading modes where the tracking mode is shown on the left side, and the locking mode is shown on the right side. While in the tracking mode, a error can be detected by state machine 90b at state 130. Once detected, the receiver-generated PRBS is generated and an offset is sent to the barrel shifter at state 132. A sequence of compare states occurs as part of the wait state operation, beginning at state 132, and ending at state 136. If no errors are encountered by the comparator, then the locking mode is entered at state 138. Otherwise, state 140 occurs and the error flag is reset at state 130. The tracking mode is then looped again by incrementing the offset and loading initialization of the PRBS at state 132. If, however, locking mode is entered, then three successive errors must be encountered through steps 122-148 until the successive errors are recognized and state machine 90b leaves the locking mode and enters the tracking mode at step 130.

One advantage of receiver 10c and 10d is that the state machines 90a/b can be implemented at a low frequency since the result of the comparison does not need to be checked at the frame clock cycle rate. In addition, by using a PRBS, receiver 10c can achieve a very fast convergence since the worst-case N number of slip bit signals sent from synchronizer 102 are required to get the proper bit alignment. Thus, convergence can occur within 16 frame cycles if the parallel bus width is 16. A further advantage is that no specific framing character or framing sequence is necessary, and that only N XOR functions are required rather than N+1×N XOR functions. This enables low area requirements and associated low power with higher speed operation.

The receiver, regardless of whether a cycle slip framer or barrel shift framer is used, enjoys the benefits of a lower gate count, lower power, and smaller overall footprint than receivers which use a special framing character. The state diagram can be readily adapted to any number of wait states to accommodate aliasing issues, as well as any number of unlock conditions to accommodate jitter or PLL out-of-lock conditions. Convergence can be readily achieved in no more than N frame cycles absent the use of a special framing character. All such features and enhancements are readily understood by one skilled in the art upon review of the following claims.

What is claimed is:

1. A data communication receiver, comprising:
  a bit generator coupled to generate a parallel set of data bits;
  a deserializer coupled to receive a serial bitstream having the same logic value as the set of data bits sent across a communication channel to the receiver for deserializing the serial bitstream to form a deserialized serial bitstream;
  a comparator coupled to the bit generator and the deserializer for comparing the parallel set of data bits to the deserialized serial bitstream; and
  means for modifying an output of the deserializer if the deserialized serial bitstream contains one or more bits dissimilar from the parallel set of data bits.

2. The data communication receiver as recited in claim 1, wherein said comparator is coupled to compare the deserialized serial bitstream occurring within one frame cycle with the parallel set of data bits occurring also within one frame cycle.

3. The data communication receiver as recited in claim 1, wherein the serial bitstream transfers bits at a bit rate equal to a bit cycle, the deserializer is coupled to deserialize the serial bitstream into N bits, and wherein the frame cycle is equal to N bit cycles.

4. The data communication receiver as recited in claim 1, wherein the serial bitstream has the same set of logic values as the set of data bits.

5. The data communication receiver as recited in claim 1, wherein the means for modifying comprises a frame clock generator coupled to extend at least one frame clock cycle used by the deserializer to output the deserialized serial bitstream.

6. The data communication receiver as recited in claim 5, wherein the at least one frame clock cycle is extended by one bit cycle at which the serial bitstream is sampled by the deserializer.

7. The data communication receiver as recited in claim 5, wherein the frame clock generator is coupled to cumulatively shift the boundary of a frame cycle subsequent to the deserialized serial bitstream each time a bit cycle is added to the successive frame cycles.

8. The data communication receiver as recited in claim 1, wherein the means for modifying comprises a barrel shifter coupled to select a first set of bits from a first frame cycle and a second set of bits from a second frame cycle immediately subsequent to the first frame cycle, and wherein the first and second frame cycles are used by the deserializer to output the deserialized serial bitstream.

9. The data communication receiver as recited in claim 8, wherein the barrel shifter is coupled to select the first set of bits relative to the second set of bits depending on how many of the one or more bits are dissimilar from the parallel set of data bits.

10. A data framing boundary test and correction system, comprising:
  a transmitter for sending a serial bitstream of data bits;
  a receiver coupled to the transmitter by a communication link, said receiver comprising:
    deserializer for converting the serial bitstream of data bits into a deserialized serial bitstream;
    a bit generator for generating a parallel set of data bits equal in logic value to the serial bitstream of data bits; and
    a circuit that moves a bit within a single frame cycle at the output of the deserializer into an immediately preceding frame cycle if the deserialized serial bitstream contains a bit dissimilar from the parallel set of data bits.

11. The test and correction system as recited in claim 10, wherein the circuit comprises a frame clock generator coupled to extend at least one frame clock cycle used by the deserializer to output the deserialized serial bitstream.

12. The test and correction system as recited in claim 11, wherein the frame clock cycle is extended by one bit cycle at which the serial bitstream is sampled by the deserializer.

13. The test and correction system as recited in claim 10, wherein the circuit comprises a state machine that moves the bit if more than one comparison, and preferably at least three comparisons, of the parallel set of data bits with the deserialized serial bitstream yields a bit dissimilar from the parallel set of data bits.

14. The test and correction system as recited in claim 10, wherein the circuit comprises a state machine that forwards a modified deserialized serial bitstream having the bit conveyed at the output of deserializer to a comparator which compares the modified deserialized serial bitstream to the parallel set of data bits.

15. The test and correction system as recited in claim 14, wherein the comparator compares the modified deserialized serial bitstream to the parallel set of data bits at least N times and, preferably, 2N times where N is equal to the number of bits within the parallel set of data bits.

16. The test and correction system as recited in claim 15, wherein each of the N comparisons must yield the modified deserialized serial bitstream as having no bits dissimilar from the parallel set of data bits before the state machine transitions to an no error state.

17. The test and correction system as recited in claim 10, wherein the circuit comprises a barrel shifter coupled to select a first set of bits from a first frame cycle and a second set of bits from a second frame cycle immediately subsequent to the first frame cycle, and wherein the first and second frame cycles are used by the deserializer to output the deserialized serial bitstream.

18. The test and correction system as recited in claim 17, wherein the barrel shifter is coupled to select the first set of bits relative to the second set of bits depending on how many of the one or more bits are dissimilar from the parallel set of data bits.

19. A method for framing serial data, comprising:
  comparing deserialized serial data within a frame cycle to a parallel set of data bits equal in logic value to the serial data; and
  moving a bit from one frame cycle to another frame cycle if the deserialized serial data has a bit at an Nth bit position that is dissimilar in logic value than a bit at the Nth bit position of the parallel set of data bits, wherein said moving comprises extending the first frame cycle to include an additional bit cycle equal to 1/N cycles of the first frame cycle to receive the Nth bit.

* * * * *